United States Patent [19]

Montanari

[11] Patent Number: 5,103,097

[45] Date of Patent: Apr. 7, 1992

[54] INFRARED DETECTION DEVICE

[75] Inventor: Jean L. Montanari, Herbeys, France

[73] Assignee: Societe Francaise de Detecteurs Infrarouges - SOFRADIR, Chatenay Malabry, France

[21] Appl. No.: 569,006

[22] Filed: Aug. 17, 1990

[30] Foreign Application Priority Data

Aug. 22, 1989 [FR] France .................. 89 11287

[51] Int. Cl.$^5$ .............................. G01J 5/06
[52] U.S. Cl. ........................ 250/352; 250/370.15
[58] Field of Search ............ 250/352, 338.1, 370.15

[56] References Cited

U.S. PATENT DOCUMENTS

| | | |
|---|---|---|
| 3,259,865 | 7/1966 | Lederhandler et al. |
| 3,963,926 | 6/1976 | Borrello .................. 250/352 X |
| 4,253,022 | 2/1981 | Allen et al. .............. 250/352 X |
| 4,443,303 | 4/1984 | Freeman ................. 250/338.1 X |
| 4,446,372 | 5/1984 | Gurnee .................... 250/352 X |
| 4,488,414 | 12/1984 | Jungkman et al. ......... 250/352 X |
| 4,675,525 | 6/1987 | Amingual et al. ......... 250/352 X |
| 4,766,316 | 8/1988 | Jungkman ................... 250/352 |
| 4,795,907 | 1/1989 | Maekawa et al. ............ 250/352 |
| 4,883,967 | 11/1989 | Tsutsui et al. ............ 250/370.01 |
| 4,914,299 | 4/1990 | Jungkman et al. ........... 250/352 |
| 4,983,840 | 1/1991 | Ouvrier-Buffet et al. .... 250/352 |

FOREIGN PATENT DOCUMENTS 2629912 10/1989 France .

OTHER PUBLICATIONS

Patent Abstracts of Japan, vol. 6, No. 168 (P-139) [1046], 1982; & JP-A-57 86 016 (Fujitsu K.K.).
Patent Abstracts of Japan, vol. 6, No. 136 (E-120) [1014], 1982; & JP-A-57 62 569 (Fujitsu K.K.).
Patent Abstracts of Japan, vol. 10, No. 330 (P-514) [2386], 1986; & JP-A-61 137 028 (Toshiba Corp.).
Patent Abstracts of Japan, vol. 6, No. 245 (P-159) [1123], 1986 & JP-A-57 142 526 (Fujitsu K.K.).

Primary Examiner—Constantine Hannaher
Assistant Examiner—Edward J. Glick
Attorney, Agent, or Firm—Wall and Roehrig

[57] ABSTRACT

A low temperature infrared detector for use in a cryostat having a cold finger. A cold plane is mounted upon the cold finger in heat transfer relationship therewith. A read circuit board is mounted upon the cold plane and a detector circuit board is placed over the read circuit and is connected thereto both electrically and thermally. A screen is fitted over the detector circuit board. The screen has a shoulder formed in its bottom wall into which the detection board is press-fitted and a window that frames the detecting circuitry through which the circuitry can be viewed by an IR source. Preferably, the screen is produced using electroforming techniques.

5 Claims, 2 Drawing Sheets

INFRARED DETECTION DEVICE

BACKGROUND OF THE INVENTION

The present invention relates to an infrared detection device operating at low temperature. Within the meaning of the invention, the expression "low temperature" is understood to refer to temperatures within the range between 50 and 130 degrees Kelvin (K).

Such infrared detection devices operating at low temperature are generally associated with a cryostatic chamber (Dewar Vessel also called cryostat) containing, depending upon the temperature of use, liquid nitrogen or helium or a cryogenerator device. The detection device per se consists of a plurality of unitary detectors, referred to as photosites, formed collectively by the techniques of microelectronics on a semiconductor material sensitive to infrared radiation. Such materials, which are known in other respects, most frequently consist of the semiconducting ternary alloys of general formula $Cd_xHg_{0.5-x}Te_{0.5}$, where x is in the range between 0 and 0.5.

These detectors are in heat exchange with the cryostat, this taking place via a cold finger.

The application of the detected photon radiations is implemented by means of a read circuit associated with the detector per se, which is likewise in heat exchange with the cryostat.

The connections between the detectors per se and the read and application circuit are generally formed by connecting cables, or even by a collective weld by means of indium microspheres.

This last mentioned technique, the preferred field of application of the invention, makes possible the illumination of the detection circuits by their rear face, thus avoiding the utilization of any connection which is bulky and inconvenient in practical terms.

Such an assembly, which consists of the detection circuit connected to the read circuit, is referred to in the continuation of the description as a detection unit.

In view of the structure of such infrared detection devices, the detectors are generally associated with a cold screen perforated by a window fulfilling the function of a diaphragm, this being so in order to limit the extraneous reflections generated either by the hot parts of the cryostat or by the useful radiation itself, after it has undergone reflections and/or refractions on and in the materials of the detection circuit and the application circuit. When such radiations reach the photosites, they generate incoherent electrical signals which thus impair the electro-optical performance levels of the system which, in the absence, of such extraneous radiations would approach the theoretical accuracy.

More specifically, the principal origin of these extraneous radiations is the reflection on the metallic tracks of the electrical connections, on the actual surface of the detection circuit on account of the inevitable imperfections of antireflection processing on the surface of said detection circuit.

As has already been stated, the utilization of a diaphragm screen to limit these phenomena permits the limiting of the lateral radiation. Nevertheless, it must obligatorily be brought to low temperature and thus be connected to the cold finger of the cryostat in order to limit its own radiation; this thus assumes both a mechanical and a thermal link.

Such a construction is described in the French patent application filed by the Applicant under No. 88/10,814.

Although it is certainly the case that the utilization of a cold diaphragm screen permits a limitation of the extraneous radiation on the other hand it exhibits a certain number of disadvantages. It is possible to mention, first of all, the fact that the formation of such parts by mechanical means, even processed ones, does not permit the formation of apertures of the diaphragms which are as small and as well positioned as would be desirable, in view of the dimensions of the detectors. Furthermore, the mechanical assembly of the screen to the cold finger of the cryostat proves to be particularly difficult, in view of the fact that the aperture of the diaphragm is situated in proximity to the rear face of the detection circuit. This requires the imparting, to this aperture, of sizeable dimensions, in view of the fact that the detector is in general positioned on a read circuit which is generally associated with a ceramic intended to provide the connection. It is the latter which is itself secured to the cold finger. Thus, it is necessary to take into account the accumulation of both the lateral and vertical tolerances in order to impart adequate dimensions to the aperture, in order not to mask off a part of the useful radiation. This thus leads to an effectiveness which is limited both by the size of such an aperture and by the inevitable spacing separating the screen from the rear face of the detection circuit.

Furtheremore, having regard to the distance separating the screen from the cold finger as well as to the need to fix said screen mechanically to the latter, this leads to dimensions which create particular difficulties not only in respect of the rapid lowering of the temperature of the screen, but also in respect of the achievement of a screen temperature which is as close as possible to that of the detector, even when using materials exhibiting a good thermal conductivity. Moreover, the need to fix it mechanically to the cold finger of the cryostat obstructs in part the lateral possibilities for connection. Finally, having regard to the dimensions and correspondingly to the mass of this screen, the utilization of this type of device is limited under high accelerations, on account of the deformations and vibrations which are inevitably induced.

SUMMARY OF THE INVENTION

The object of the present invention is to alleviate these disadvantages. Its object is to provide an infrared detection device which is equipped with a diaphragm screen capable of protecting said device from extraneous radiation mentioned herein above, without nevertheless giving rise to the disadvantages set forth.

The subject of the present invention is an infrared detection device operating at low temperature, comprising:

a cryostat equipped with a cold finger intended to provide a heat exchange with a cold source;

a cold plane disposed generally perpendicularly in relation to the cold finger and in heat exchange relation with the latter;

a read circuit associated with a connection circuit board, fixed above said cold plane and in heat exchange relation with the latter;

a detection circuit board, parallel to said read circuit and connected electrically and thermally to the latter by means of Indium microspheres;

a screen equipped with a window forming a diaphragm situated between the detection circuit board and the source of infrared radiation to be detected.

This infrared detection device is defined in that the screen is pressed against the detection circuit board and is in heat exchange relation exclusively with the latter.

In other words, the object of the present invention is to reduce the distance separating the diaphragm of the screen and the rear face of the detection circuit board to a distance which is zero or almost zero by appropriate fixing of the screen on said detection circuit, thus eliminating, on the one hand, the disadvantages associated with the mechanical fixing of the screens known up to that point and, on the other hand, the extraneous radiations originating from the reflections and other refractions on the path separating the diaphragm from the detector.

Advantageously in practice:

the screen is positioned on the detection circuit board by tight force fitting on the edges of said circuit board;

the securing of the screen on the detection circuit is achieved by adhesive bonding or gluing;

the screen is formed by electroforming of a single metal;

the screen exhibits a composite structure formed by electroforming of two or more metals; the electroforming technique being capable of producing parts of small dimensions, proves to be particularly suitable for the formation of the screen according to the invention. In fact, the securing on the detection circuit of a screen formed by a mechanical method, and thus sigificantly heavier, would encumber the implementation of the invention and, at the very least, its application;

the screen is blackened by anodization, by painting or by covering with an appropriate material.

BRIEF DESCRIPTION OF THE DRAWINGS

The manner in which the invention may be implemented and the advantages which arise therefrom will become more clearly evident from the illustrative embodiment which follows, which is given on an indicative and non-limiting basis in support of the accompanying figures.

DESCRIPTION OF THE DRAWINGS

Figure 1:
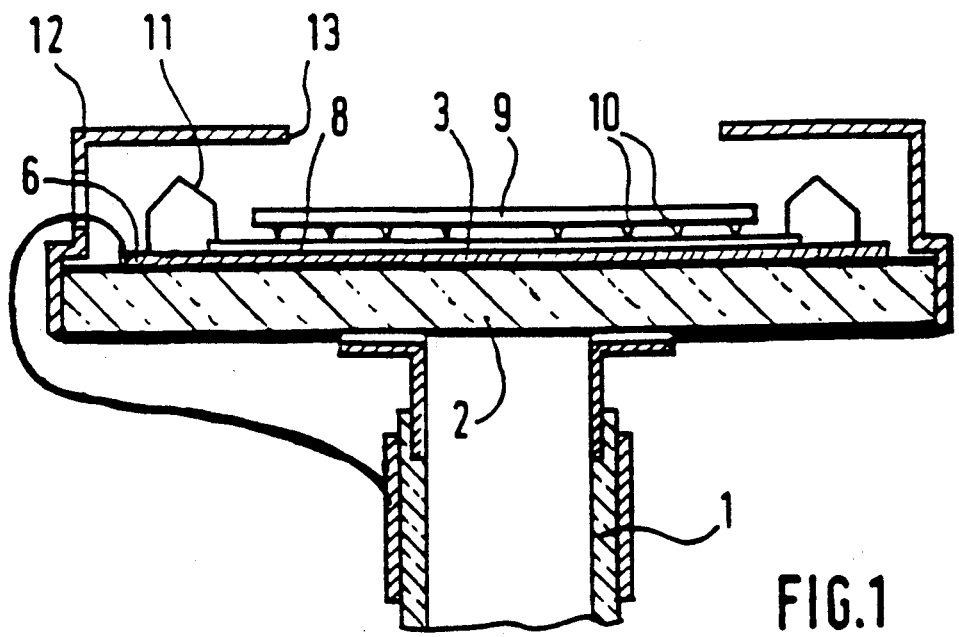
FIG. 1 is a cross-sectional view of a detection device of the prior art and, more specifically, in accordance with French Patent Application No. 88/10,814 filed by the Applicant.

In a known manner, an infrared detection device is enclosed in a cryostatic chamber (not shown). Such a chamber comprises, on the one hand, a metallic external casing provided, on one of its faces, with an optical window, in particular transparent to infrared radiations and made, for example, of germanium, sealing said chamber and open on the other side, and, on the other hand, a cooling sleeve disposed coaxially within the chamber. This sleeve comprises essentially two parts, respectively an external part intended to receive a cryogenerator, for example a liquid gas such as nitrogen or helium, depending upon the desired operating temperature, and an internal part forming a cold finger, which exists in the form of a tube intended to contain the plunger of the cryogenerator. The external chamber and the cold finger are assembled in a sealed manner and thus constitute a Dewar flask placed under vacuum.

The cold finger (1) is surmounted, at its upper end, within the described cryostat, by a cold plane (2) perpendicular to the cold finger. This cold plane is made of a material which conducts heat at low temperature, that is to say a material having a thermal conductivity greater than 1 Watt.centimeter.Kelvin (W.cm.K) in the aforementioned temperature range. Advantageously, the cold plane is made of a ceramic material, for example of alumina or even possibily of metal.

This cold plane (2) is surmounted by another ceramic plate (3), on which the detection unit (8,9,10) is deposited and which permits the establishment of the electrical connections between the latter and the conductor network of the cryostat by means, for example of a network of conductive tracks screen-printed on this ceramic.

The connecting plate (3) is surmounted by a read and application circuit (8).

Finally, the assembly is surmounted by the detection circuit per se (9) which is connected electrically and thermally to the read and application circuits by means of Indium microspheres (10).

Thus, as these various elements are in close contact and are made, for the greater part, from materials which conduct heat, their temperature is very close to that of the cold finger.

The metallic studs (6) are linked by weld wires (11) to the various electrical contact studs of the read and application circuit.

Fundamentally, a cold screen (12) formed by a continuous metal frame situated between the detection circuit and the window transparent to infrared radiations of the cryostatic chamber, is integrated mechanically and thermally with the cold plane (2). The metal frame (12) appears through a window of rectangular cross-section for example, fulfulling the function of a diaphragm. As has already been stated, the diaphragm is intended to limit the extraneous radiations principally emanating from the hot walls of the cryostat and from the reflections of the useful radiation on the reflective surfaces (metal connecting studs, etc).

The aforegoing description relates to the prior art and clearly demonstrates that, in spite of the utilization of a material which is a good conductor of heat for the diaphragm (12), there is a substantial temperature difference between the end (13) of the diaphragm and the cold finger (1). This temperature difference gives rise to an emition of extraneous radiations by the diaphragm, which radiations are detected by the detection circuit (9), inducing impairments at the reconstruction stage. Furthermore, and as has already been stated, having regard to the relative complexity of the detection assembly, namely the infrared detectors per se, the read and application circuits, the connection plate and the cold plane, the construction creates a certain number of errors linked to the tolerances which are additive and may thus give rise to a partial masking-off of the useful radiation unless care has been taken to oversize the aperture. Nevertheless, this aperture, which is larger than that necessitated by an ideal positioning, suffers a loss of effectiveness, just like the screen, as a result of the need to be situated at certain distances from the rear face of the detection circuit (9).

Figure 2:
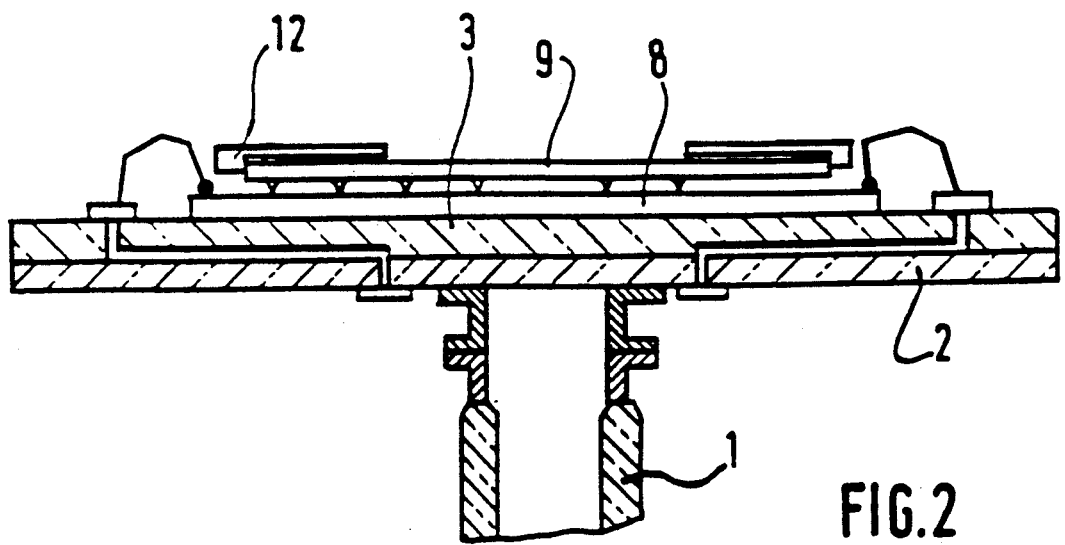
FIG. 2 is a similar cross-sectional view of the detection device according to the invention.
Figure 3:
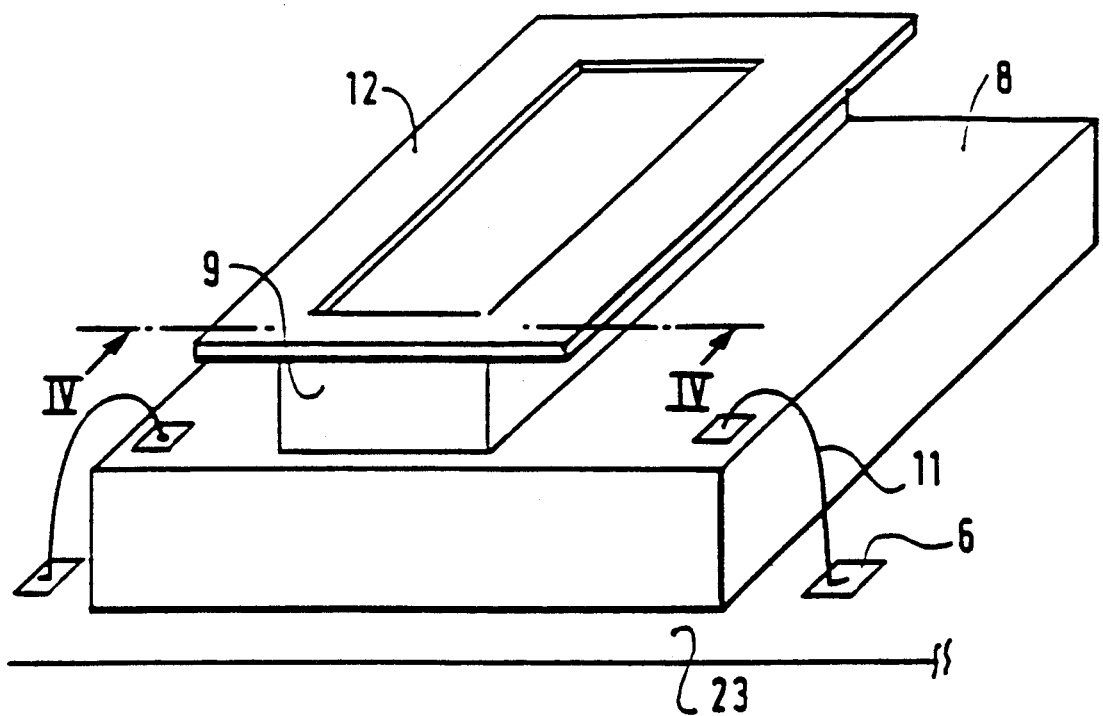
FIG. 3 is a perspective general view representing the details of the positioning of the screen on the detection circuit.

FIG. 2 is a view similar to FIG. 1 but in which the diaphragm according to the invention has been shown. As can be seen in this Figure the diaphragm (12) is force-fitted onto the detector board (9). This force-fitting of the diaphragm onto the detector board is itself represented in FIGS. 3 and 4. A shoulder is formed at the location of the inner edge of the screen (12) intended to bear on the edge of the detector board (9). The securing and the integration of the diaphragm screen on the detector (9) are implemented by adhesive bonding, for example by means of the adhesive of the EPO-TEK H7OE type.

Figure 4:
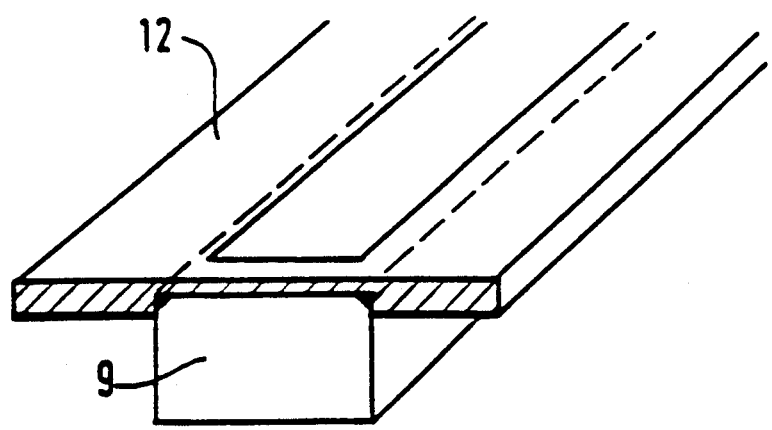
FIG. 4 is a cross-sectional view along the line IV—IV of FIG. 3.

As can be seen in detail in FIG. 4, this force-fitting is made possible by the actual structure of the screen. In fact, the latter exhibits, at the location of the edge of the diaphragm, a shoulder intended to be positioned on the edges of the detection circuits.

According to a significant feature of the inventio, the diaphragm screen (12) according to the invention is formed by electroforming. In fact this technique, which is known in other respects, permits the formation of parts of very small dimensions with a great precision. Electroforming is a process for producing parts formed directly by electrodeposition on a mold. Thus, a screen secured to the detection circuit exhibits dimensions close to or even slightly greater than the circuit and, in any event, far smaller than the screens of the prior art, having regard to the fact that in the latter case they had to circumscribe all the components of the assembly, namely the detection circuit per se, the read and application circuit, the connection plate and the cold plane respectively. Furthermore, the choice of this production method makes it possible to produce parts exhibiting two different thicknesses, such as the diaphragm screen according to the invention. In fact, the periphery of this diaphragm screen exhibits a typical thickness of a 100 micrometers, while the central zone bearing on the detection circuit exhibits only a thickness of 10 micrometers, for a rectangular detection circuit of dimensions 3 mm × 8 mm. This configuration with two thicknesses thus permits the imparting of a certain rigidity to the screen for a minimum increase in mass. Furthermore, it facilitates the force-fitting and the positioning of the screen, while increasing the accuracy of positioning, since it is formed exclusively with reference to the edge of the detection circuit board.

It is likewise possible to form the screen according to the invention from a composite of a plurality of metals, still using an electroforming technique. In this case, the metals employed are principally nickel, copper, silver or gold, the choice from among these metals being made as a function of the specific requirements of each type of device (matching of the coefficience of expansion, thermal conductivity . . . ). As has already been stated, the electroforming process likewise permits the production of a screen of composite structure, which screen consists of stacks of layers of different metals.

Finally, the screens formed by electroforming and according to the invention may be blackened, for example, by anodization, reducing even more the extraneous radiations.

The present invention brings numerous advantages in relation to the devices known as at the present date.

First of all, the structure of such a screen permits the assembly of said screen on the detection circuit before depositing the assembly in the cryostat. Thus, the invention permits the indexing and positioning of this screen in relation to the detection zone on a site different from the cold finger of the cryogenic chamber. This results, on the one hand, in a great ease and a great freedom of implementation and, on the other hand, in a greater accuracy of positioning in relation to the detection zone, having regard to the fact that the uncertainties relating to the cold finger and to the assembly of the connection ceramics and to the read and application circuit are then without effect.

Furthermore, such a screen permits freedom from the lateral mechanical links to the cold finger of the cryostat, thus leaving this lateral space intact and available for any other use and especially for use for connection purposes.

The elimination of the space between screen and detection circuit achieves totality of the masking off of the extraneous radiation for that part of the circuit thus masked, tending towards permitting the achievement of results close to theoretical perfection.

The intimate detection circuit-screen contact imparts to the screen a temperature very close to that of the detector, a result which cannot be achieved with any of the devices known hitherto. Likewise, this arrangement associated with a low mass ensures a very rapid descent to cold conditions.

Futheremore, the formation of such a screen by the technique of electroforming permits the formation of a screen having a geometry which is perfectly defined with a very great accuracy. Furthermore, the thickness of the mask obtained by electroforming can be fully controlled. Moreover, the formation of a mask having two thickness zones makes it possible to force-fit and to auto-index the screen on the detection circuit.

The nature of the material of the screen is variable in dependence upon the system receiving the screen. Thus, it is possible to match the various parameters, especially the coefficients of expansion and high thermal conductivity. Finally, the formation of such screens by electroforming achieves a substantial reduction in the costs and the weight, while increasing the accuracy.

I claim:

1. A low temperature infrared detection device for use in association with a cryostat that is equipped with a cold finger, said detection device including
   a cold plane mounted upon the cold finger for supporting a ceramic plate having read and application circuit means mounted thereon,
   a circuit board mounted upon the ceramic plate containing detection circuit means that is connected to the read and application circuit means, said circuit board having a predetermined thickness and an outer periphery of given size and shape,
   a thin cold screen having a recess formed in the bottom surface that has a depth that is less than the thickness of the circuit board, said recess being of a size and shape that complements that of the outer periphery of said circuit board, said cold screen further including a diaphragm opening passing downwardly through its top surface into said recess, and
   said circuit board being press-fitted into the recess of said cold screen so that the diaphragm opening frames the detection circuit means and the side walls and top wall of the recess are in tight, intimate contact with the side walls and top wall of the circuit board to maximize heat flow between the circuit board and the cold screen and to minimize the mass of the screen.

2. The low temperature detection of claim 1 wherein the depth of the diaphragm opening is about one-tenth the thickness of the cold shield.

3. The low temperature detection device of claim 2 wherein the depth of the diaphragm opening is about 10 micrometers and the thickness of the cold shield is about 100 micrometers.

4. The low temperature detection device of claim 3 wherein a cold shield is formed of a material that is selected from the group consisting of metals and composite materials.

5. The low temperature detection device of claim 1 wherein the cold shield is formed of a dark material to minimize radiant heating.

* * * * *